United States Patent [19]
Hasegawa

[11] Patent Number: 4,866,305
[45] Date of Patent: Sep. 12, 1989

[54] MULTIPLE-INPUT MULTIPLE-OUTPUT DECODING CIRCUIT

[75] Inventor: Takashi Hasegawa, Kawasaki, Japan

[73] Assignee: Fujitsu Limited, Kawasaki, Japan

[21] Appl. No.: 122,088

[22] Filed: Nov. 17, 1987

[30] Foreign Application Priority Data

Dec. 19, 1986 [JP] Japan ................... 61-304568

[51] Int. Cl.$^4$ .......................... H03K 19/177
[52] U.S. Cl. .................... 307/449; 307/448; 307/451; 307/585; 341/50
[58] Field of Search .............. 341/50; 307/448–452, 307/463, 468, 469, 577, 579, 584, 585

[56] References Cited

U.S. PATENT DOCUMENTS

| | | | |
|---|---|---|---|
| 4,350,905 | 9/1982 | Sato | 307/449 X |
| 4,453,096 | 6/1984 | Le Can et al. | 307/451 X |
| 4,607,176 | 8/1986 | Burrows et al. | 307/449 |
| 4,617,477 | 10/1986 | DePaolis, Jr. | 307/451 X |
| 4,684,829 | 8/1987 | Uratani | 307/449 |
| 4,710,649 | 12/1987 | Lewis | 307/451 |
| 4,739,195 | 4/1988 | Masaki | 307/451 X |

*Primary Examiner*—David Hudspeth
*Attorney, Agent, or Firm*—Armstrong, Nikaido, Marmelstein, Kubovcik & Murray

[57] ABSTRACT

A decoding circuit comprises an m row by n column matrix arrangement of transmission gates, wherein an output terminal of one of two mutually adjacent transmission gates in each column of the matrix arrangement is connected to an input terminal of the other of the two mutually adjacent transmission gates, input terminals of the n transmission gates in a last row are connected to a high voltage source, output terminals of the n transmission gates in a first row are connected to a low voltage source, and gates of the transmission gates are connected so that all of the n transmission gates in a predetermined row are simultaneously turned OFF responsive to an n-bit input code having a predetermined value.

4 Claims, 4 Drawing Sheets

MULTIPLE-INPUT MULTIPLE-OUTPUT DECODING CIRCUIT

BACKGROUND OF THE INVENTION

The present invention generally relates to decoding circuits, and more particularly to a decoding circuit for decoding an input code into a first predetermined number of high-level outputs and a second predetermined number of low-level outputs.

As will be described later in the present specification in conjunction with a drawing, a first conventional decoding circuit comprises a decoding part and a distributing part. With respect to a 2-bit input code, for example, the decoding part comprises four 2-input NAND gates, and the distributing part comprises a 4-input NAND gate, a 3-input NAND gate, a 2-input NAND gate and an inverter. However, this first conventional decoding circuit suffers disadvantages in that the distributing part requires multiple-input NAND gates and it is difficult to produce the decoding circuit having such a distributing part in the form of a semiconductor integrated circuit because of the large number of transistors required.

On the other hand, as will be described later in the present specification in conjunction with a drawing, a second conventional decoding circuit also comprises a decoding part and a distributing part. With respect to a 2-bit input code, for example, the decoding part also comprises four 2-input NAND gates, but the distributing part comprises four inverters and four transmission gates. According to this second conventional decoding circuit, the distributing part does not have multiple-input NAND gates. For this reason, the second conventional decoding circuit is more suited for production in the form of the semiconductor integrated circuit than the first conventional decoding circuit. However, as the number of bits of the input code increases, the construction and scale of the decoding circuit become extremely complex and large. Therefore, there is a demand to minimize the number of transistors required in the decoding circuit especially as the number of bits of the input code becomes large.

On the other hand, there are cases where the decoding logic of the decoding circuit needs to be changed. But according to the conventional decoding circuits, it is difficult and time consuming to modify the circuit construction of the decoding circuit so that the decoding logic is changed to a desired decoding logic, especially as the number of bits of the input code becomes large Hence, there is also a demand to realize a decoding circuit in which it is relatively simple to change the decoding logic.

SUMMARY OF THE INVENTION

Accordingly, it is a general object of the present invention to provide a novel and useful decoding circuit in which the disadvantages described before are eliminated and the demands described heretofore are satisfied.

Another and more specific object of the present invention is to provide a decoding circuit comprising an m row by n column matrix arrangement of transmission gates, wherein an output terminal of one of two mutually adjacent transmission gates in each column of the matrix arrangement is connected to an input terminal of the other of the two mutually adjacent transmission gates, input terminals of the n transmission gates in a last row are connected to a high voltage source, output terminals of the n transmission gates in a first row are connected to a low voltage source, and gates of the transmission gates are connected so that all of the n transmission gates in a predetermined row are simultaneously turned OFF responsive to an n-bit input code having a predetermined value. According to the decoding circuit of the present invention, the number of transistors constituting the decoding circuit is small compared to the conventional decoding circuits, and the effect of minimizing the number of transistors becomes especially notable as the number of bits of the input code increases. Hence, it is possible to produce the decoding circuit in the form of the semiconductor integrated circuit having an extremely large integration density. Furthermore, it is relatively simple to change the decoding logic.

Other objects and further features of the present invention will be apparent from the following detailed description when read in conjunction with the accompanying drawings.

DETAILED DESCRIPTION

First, a description will be given on the conventional decoding circuits so as to facilitate the understanding of the problems of the conventional decoding circuits and the superior effects obtainable according to the present invention.

Figure 1:
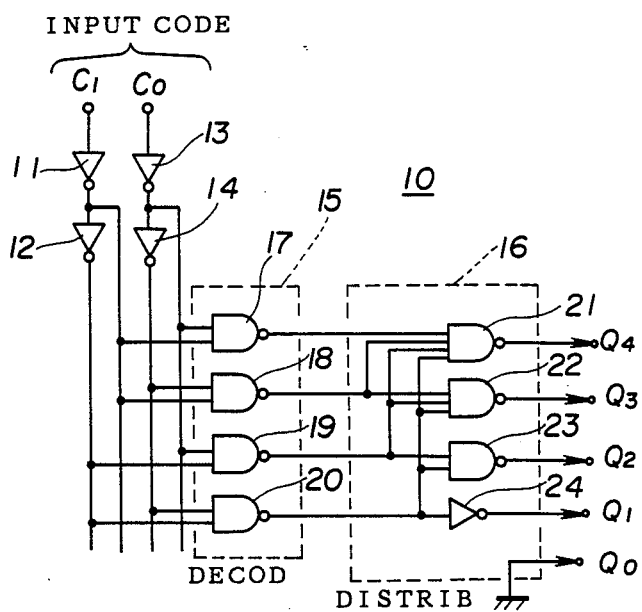
FIG. 1 is a circuit diagram showing a first example of the conventional decoding circuit.

FIG. 1 shows a first example of the conventional decoding circuit. A decoding circuit 10 comprises inverters 11 through 14, a decoding part 15 and a distributing part 16. The decoding part 15 comprises four 2-input NAND gates 17 through 20, and the distributing part 16 comprises a 4-input NAND gate 21, a 3-input NAND gate 22, a 2-input NAND gate 23 and an inverter 24. The following Table shows a truth table for explaining the operation of the decoding circuit 10, where $C_0$ and $C_1$ denote bits of the input code and $Q_0$ through $Q_4$ denote bits of the decoded output.

TABLE

| Decoded Output Bit | Input Code $C_1C_0$ | | | |
|---|---|---|---|---|
| | 00 | 01 | 10 | 11 |
| $Q_4$ | 1 | 1 | 1 | 1 |

TABLE-continued

| Decoded Output Bit | Input Code $C_1C_0$ | | | |
|---|---|---|---|---|
| | 00 | 01 | 10 | 11 |
| $Q_3$ | 0 | 1 | 1 | 1 |
| $Q_2$ | 0 | 0 | 1 | 1 |
| $Q_1$ | 0 | 0 | 0 | 1 |
| $Q_0$ | 0 | 0 | 0 | 0 |

When the bits $C_0$ and $C_1$ of the input code are both "0", only the output of the NAND gate 17 of the decoding part 15 is low to indicate the logic level (hereinafter simply referred to as a level) "0". Accordingly, only the output $Q_4$ of the NAND gate 21 of the distributing part 16 is high to indicate the level "1", and the remaining outputs $Q_0$ through $Q_3$ are low indicating the level "0".

Next, when the bits $C_0$ and $C_1$ of the input code are "1" and "0", respectively, only the output level of the NAND gate 18 of the decoding part 15 is "0." Hence, the output $Q_4$ of the NAND gate 21 and the output $Q_3$ of the NAND gate 22 of the distributing part 16 have the level "1", and the remaining outputs $Q_0$ through $Q_2$ have the level "0".

Similarly, when the bits $C_0$ and $C_1$ of the input code are "0" and "1", respectively, the outputs $Q_2$ through $Q_4$ have the level "1", and the remaining outputs $Q_0$ and $Q_1$ have the level "0". In addition, when the bits $C_0$ and $C_1$ of the input code are both "1", the outputs $Q_1$ through $Q_4$ have the level "1" and the output $Q_0$ has the level "0".

Therefore, according to the decoding circuit 10, it is possible to divide the outputs $Q_0$ through $Q_4$ into the levels "0" and "1" depending on the value of the bits $C_0$ and $C_1$ constituting the input code.

But according to the decoding circuit 10, the distributing part 16 uses multiple-input NAND gates which are constituted by a large number of transistors, and the decoding circuit 10 is unsuited for production in the form of a semiconductor integrated circuit in that an extremely large number of transistors are required.

Figure 2:
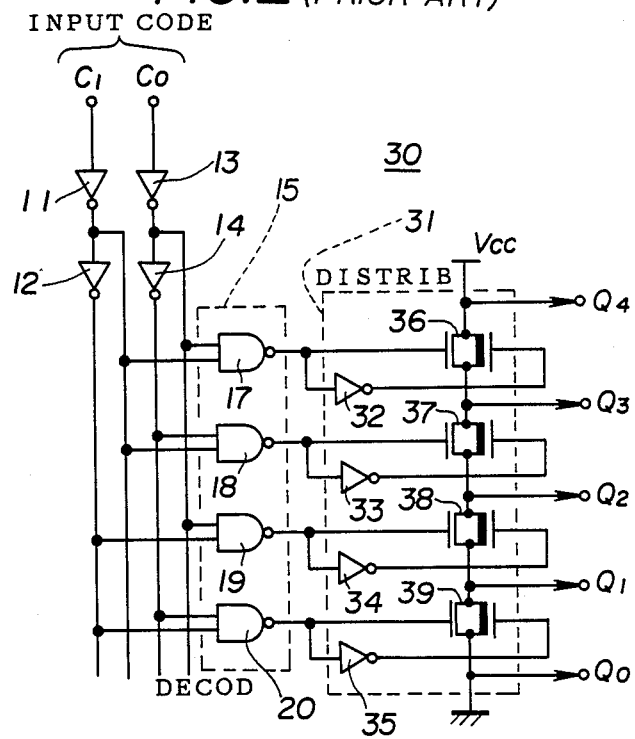
FIG. 2 is a circuit diagram showing a second example of the conventional decoding circuit.

FIG. 2 shows a second example of the conventional decoding circuit which also operates in accordance with the truth table shown in the Table described before. In FIG. 2, those parts which are the same as those corresponding parts in FIG. 1 are designated by the same reference numerals, and a description thereof will be omitted. A decoding circuit 30 comprises the decoding part 15 and a distributing part 31. The distributing part 31 comprises inverters 32 through 35 and transmission gates 36 through 39 In FIG. 2, Vcc denotes the power source voltage.

The decoding circuit 30 is more suited for production in the form of the semiconductor integrated circuit compared to the decoding circuit 10, because the distributing part 31 does not use multiple-input NAND gates. However, for each of the outputs $Q_0$ through $Q_3$, there are provided a 2-input NAND gate, an inverter and a transmission gate. Hence, as the number of bits of the input code increases, the construction and scale of the decoding circuit 30 become extremely complex and large.

Therefore, there is a demand to minimize the number of transistors required in the decoding circuit especially as the number of bits of the input code becomes large.

On the other hand, there are cases where the decoding logic of the decoding circuit needs to be changed. But according to the conventional decoding circuits 10 and 30, it is difficult and time consuming to modify the circuit construction of the decoding circuits so that the decoding logic is changed to a desired decoding logic, especially as the number of bits of the input code becomes large. Hence, there is also a demand to realize a decoding circuit in which it is relatively simple to change the decoding logic.

Accordingly, the present invention provides a decoding circuit in which the number of transistors is minimized and the decoding logic can be changed with a simple modification of the logic circuit.

Figure 3:
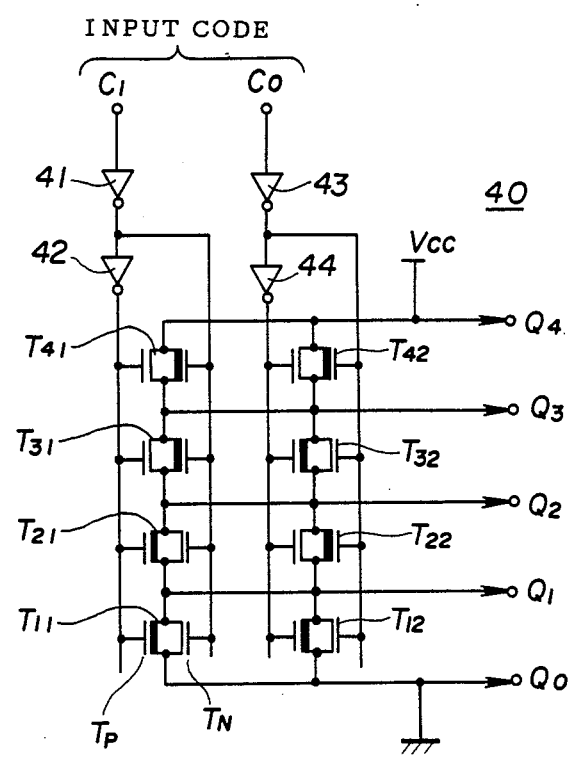
FIG. 3 is a circuit diagram showing an embodiment of the decoding circuit according to the present invention.

FIG. 3 shows an embodiment of the decoding circuit according to the present invention. A decoding circuit 40 comprises inverters 41 through 44, and a four row by two column matrix arrangement of transmission gates $T_{11}$ through $T_{42}$. In FIG. 3, Vcc denotes the power source voltage. This decoding circuit 40 also operates in accordance with the truth table shown in the Table described before.

Each of the transmission gates $T_{11}$ through $T_{42}$ are constituted by a P-channel metal oxide semiconductor (MOS) transistor $T_P$ and an N-channel MOS transistor $T_N$ which are connected in parallel. Complementary MOS (CMOS) transistors are used for each transmission gate in the present embodiment. The transmission gates $T_{11}$ through $T_{42}$ are connected so that the transmission gates $T_{41}$ and $T_{42}$ of the fourth row are simultaneously turned OFF when $C_0=0$ and $C_1=0$, the transmission gates $T_{31}$ and $T_{32}$ of the third row are simultaneously turned OFF when $C_0=1$ and $C_1=0$, the transmission gates $T_{21}$ and $T_{22}$ of the second row are simultaneously turned OFF when $C_0=0$ and $C_1=1$, and the transmission gates $T_{11}$ and $T_{12}$ of the first row are simultaneously turned OFF when $C_0=1$ and $C_1=1$.

Next, a description will be given on the operation of the decoding circuit 40 by referring to the Table described before. First, when $C_0=0$ and $C_1=0$, the transmission gates $T_{41}$ and $T_{42}$ of the fourth row are simultaneously turned OFF, but the transmission gates in the other rows are not turned OFF simultaneously. As a result, $Q_4=1$ and $Q_0=Q_1=Q_2=Q_3=0$.

When $C_0=1$ and $C_1=0$, the transmission gates $T_{31}$ and $T_{32}$ of the third row are simultaneously turned OFF, but one of the transmission gates in each of the other rows is turned ON. For this reason, $Q_4=Q_3=1$ and $Q_0=Q_1=Q_2=0$.

When $C_0=0$ and $C_1=1$, the transmission gates $T_{21}$ and $T_{22}$ of the second row are simultaneously turned OFF. Accordingly, $Q_4=Q_3=Q_2=1$ and $Q_0=Q_1=0$.

When $C_0=1$ and $C_1=1$, the transmission gates $T_{11}$ and $T_{12}$ of the first row are simultaneously turned OFF. Thus, $Q_4=Q_3=Q_2=Q_1=1$ and $Q_0=0$.

Therefore, according to the present embodiment, both the transmission gates of a predetermined row are simultaneously turned OFF responsive to an input code having a predetermined value. As a result, the function of decoding the input code and dividing the outputs $Q_0$ through $Q_4$ into the levels "0" and "1" depending on the value of the bits $C_0$ and $C_1$ constituting the input code are both provided by the matrix arrangement of the transmission gates. Hence, it is possible to reduce the number of transistors constituting the decoding circuit 40, and compared to the conventional circuit 30, it is possible to reduce the number of transistors for one output by a number of transistors required to constitute a 2-input NAND gate.

In the present embodiment, the input code is made up of the two bits $C_0$ and $C_1$, but the input code may be made up of three or more bits. The effect of reducing the number of transistors required in the decoding circuit of the present invention becomes more notable as the number of bits of the input code increases.

Furthermore, the decoding logic of the decoding circuit 40 can be changed by simply interchanging the connection of the P-channel and N-channel MOS transistors constituting one or more predetermined transmission gates depending on the desired decoding logic.

Figure 4:
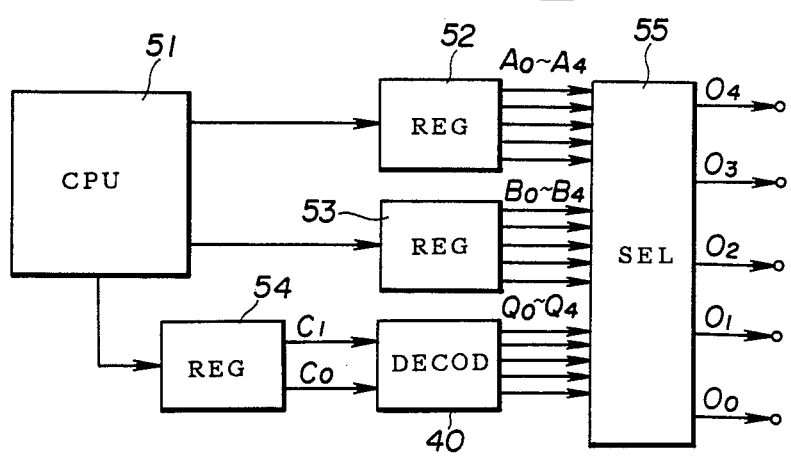
FIG. 4 is a system block diagram showing a microcomputer applied with the embodiment of the decoding circuit according to the present invention for the purpose of selecting outputs of registers.

FIG. 4 shows a microcomputer applied with the embodiment of the decoding circuit according to the present invention for the purpose of selecting outputs of registers. In FIG. 4, a microcomputer 50 comprises a central processing unit (CPU) 51, registers 52 through 54, the decoding circuit 40 and a selector 55. The register 52 stores bits $A_0$ through $A_4$ of a datum A from the CPU 51, and the register 53 stores bits $B_0$ through $B_4$ of a datum B from the CPU 51. The outputs of the registers 52 and 53 are supplied to the selector 55, and the selector 55 selectively outputs predetermined ones of the bits $A_0$ through $A_4$ and the bits $B_0$ through $B_4$ as output bits $O_0$ through $O_4$ of an output port of the microcomputer 50. The register 54 stores the input code which determines which ones of the bits $A_0$ through $A_4$ and the bits $B_0$ through $B_4$ are to be selectively output from the selector 55, and the bits $C_0$ and $C_1$ of the input code are supplied to the decoding circuit 40. The outputs $Q_0$ through $Q_4$ of the decoding circuit 40 are supplied to the selector 55.

Figure 5:
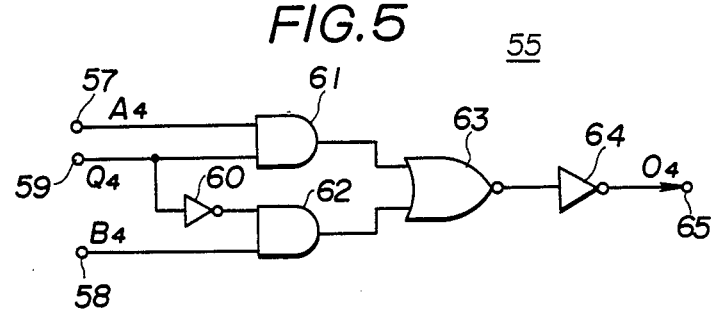
FIG. 5 is a circuit diagram showing the circuit construction of a part of a selector shown in FIG. 4.

FIG. 5 shows the circuit construction of a part of the selector 55 for selectively outputting either one of the bits $A_4$ and $B_4$. This part of the selector 55 comprises inverters 60 and 64, AND gates 61 and 62, and a NOR gate 63. The bit $A_4$ of the output datum A of the register 52 is applied to a terminal 57, and the bit $B_4$ of the output datum B of the register 53 is applied to a terminal 58. The output $Q_4$ of the decoding circuit 40 is applied to a terminal 59. The bit $A_4$ is selectively outputted through a terminal 65 as the output bit $O_4$ when the output $Q_4$ has the level "1", and the bit $B_4$ is selectively outputted through the terminal 65 as the output bit $O_4$ when the output $Q_4$ has the level "0". The circuit shown in FIG. 5 is provided for each of the remaining bits $A_0$ through $A_3$ and $B_0$ through $B_3$.

Figure 6:
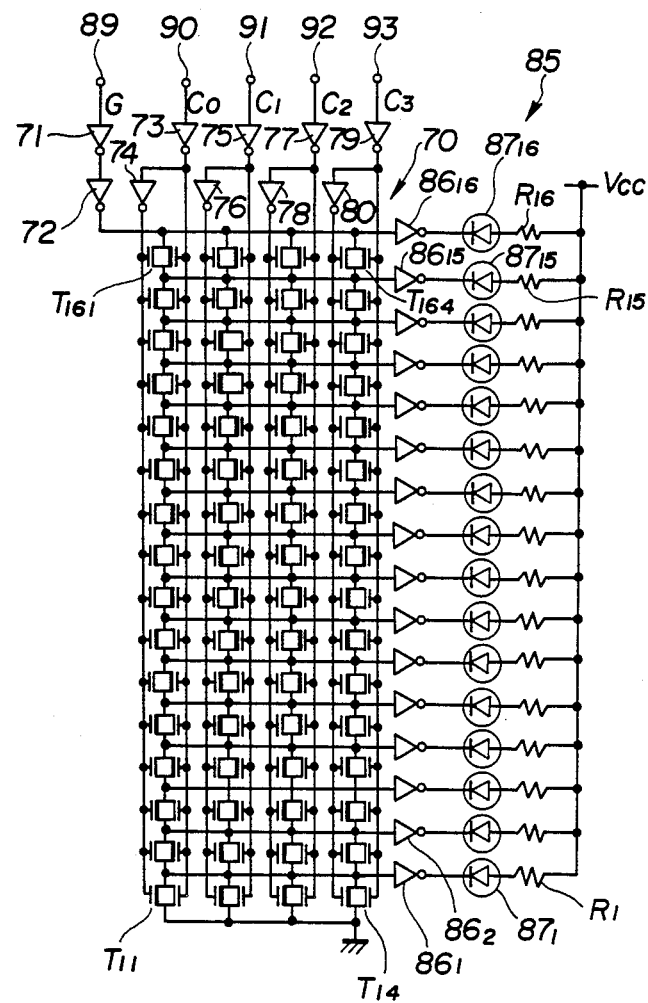
FIG. 6 is a circuit diagram showing another embodiment of the decoding circuit according to the present invention applied to a level meter.

FIG. 6 shows another embodiment of the decoding circuit according to the present invention applied to a level meter. In the present embodiment, a decoding circuit 70 comprises inverters 71 through 80, and a 16 row by 4 column matrix arrangement of transmission gates $T_{11}$ through $T_{164}$ which are connected as shown. A level meter 85 comprises inverters $86_1$ through $86_{16}$, light emitting diodes (LEDs) $87_1$ through $87_{16}$ and resistors $R_1$ through $R_{16}$. A control signal G is applied to a terminal 89, and an input code made up of bits C0 through C3 are respectively applied to terminals 90 through 93.

All of the LEDs $87_1$ through $87_{16}$ are turned OFF to display a zero level, and all of he LEDs $87_1$ through $87_1$ through $87_{16}$ are turned ON to display a maximum level. Hence, the 4-bit input code determines the level to the displayed by the LEDs $87_1$ through $87_{16}$. All of the LEDs $87_1$ through $87_{16}$ are turned OFF regardless of the value of the input code when the control signal G has the level "0". On the other hand, the ON/OFF states of the LEDs $87_1$ through $87_{16}$ are determined by the value of the input code when the control signal G has the level "1".

Figure 7:
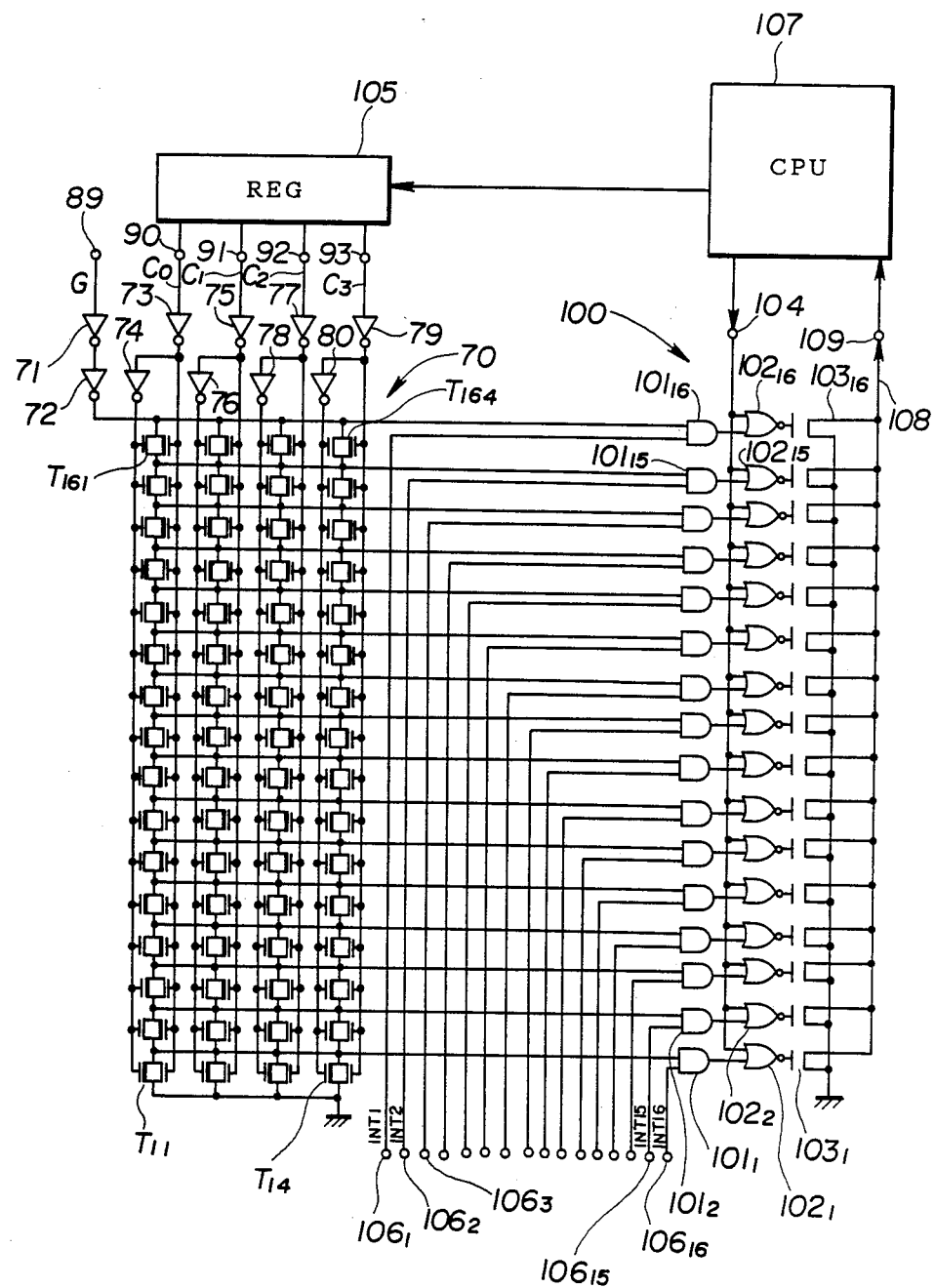
FIG. 7 is a system circuit diagram showing an essential part of a microcomputer applied with the other embodiment of the decoding circuit according to the present invention for the purpose of masking interrupt requests.

FIG. 7 shows an essential part of a microcomputer applied with the other embodiment of the decoding circuit according to the present invention for the purpose of masking interrupts. In FIG. 7, those parts which are the same as those corresponding parts in FIG. 6 are designated by the same reference numerals, and a description thereof will be omitted. An interrupt masking part 100 comprises 2-input AND gates $101_1$ through $101_{16}$, 2-input NOR gates $102_1$ through $102_{16}$ and transistors $103_1$ through $103_{16}$. Interrupt requests INT1 through INT16 are respectively applied to terminals $106_1$ through $106_{16}$, and a timing signal from a CPU 107 is applied to a terminal 104. For example, the interrupt requests INT1 through INT16 have different priorities, and the priority is higher for the interrupt requests having a larger affix number. The input code from the CPU 107 is stored in a register 105 and the bits $C_0$ through $C_3$ of the input code applied to the terminals 90 through 93. The input code determines the interrupt requests which may be made with respect to the CPU 107. One or more masked interrupt requests out of the interrupt requests INT1 through INT16 are supplied to the CPU 107 through an interrupt request line 108 and a terminal 109 depending on the decoded output of the decoding circuit 70.

As may be understood from the description given heretofore, the present invention may be applied to a decoding circuit for decoding an n-bit input code by providing an m row by n column matrix arrangement of transmission gates, where m and n are integers.

Further, the present invention is not limited to these embodiments, but various variations and modifications may be made without departing from the scope of the present invention.

What is claimed is:

1. A decoding circuit comprising:
   a first voltage source;
   a second voltage source for supplying a voltage lower than a voltage supplied by said first voltage source;
   an m row by n column matrix arrangement of transmission gates, where m is at least two and n is at least two, an output terminal of one of two mutually adjacent transmission gates in each column of said matrix arrangement being connected to an input terminal of another of said two mutually adjacent transmission gates, input terminals of the n transmission gates in a last row being connected to said first voltage source, output terminals of the n transmission gates in a first row being connected to said second voltage source; and
   inverter means for inverting each bit of an n-bit input code, said transmission gates in each column being supplied with a corresponding bit of said input code and an inverted corresponding bit of said input code from said inverter means,
   said transmission gates in said matrix arrangement having gates which are connected so that all of the n transmission gates in predetermined row are simultaneously turned off responsive to said n-bit input code having a predetermined value.

2. A decoding circuit as claimed in claim 1 in which each if said transmission gates are made up of a P-channel transistor and an N-channel transistor which are connected in parallel.

3. A decoding circuit as claimed in claim 2 in which said transmission gates in each column have gates of predetermined ones of the P-channel transistors supplied with a corresponding bit of said n-bit input code and gates of remaining ones of the P-channel transistors supplied with an inverted corresponding bit of said n-bit input code.

4. A decoding circuit as claimed in claim 1 in which each of said transmission gates are constituted by complementary metal oxide semiconductor transistors.

* * * * *